(12) United States Patent
Münch et al.

(10) Patent No.: US 6,497,932 B1
(45) Date of Patent: Dec. 24, 2002

(54) TRANSPORT DEVICE FOR ELECTRONIC COMPONENTS WITH AN ANTICONTAMINATION COATING

(75) Inventors: Thomas Münch, Laaber (DE); Stefan Paulus, Zeitlarn (DE)

(73) Assignee: Infineon Technologies AG, Munich (DE)

(*) Notice: Subject to any disclaimer, the term of this patent is extended or adjusted under 35 U.S.C. 154(b) by 109 days.

(21) Appl. No.: 09/597,348

(22) Filed: Jun. 19, 2000

(30) Foreign Application Priority Data

Jun. 17, 1999 (DE) .......................... 199 27 748

(51) Int. Cl.⁷ .............................................. B65D 22/00
(52) U.S. Cl. ...................... 428/34.1; 206/725; 252/511; 428/332; 428/167
(58) Field of Search ................ 428/34.1, 332, 428/167; 252/511; 206/725

(56) References Cited

U.S. PATENT DOCUMENTS

| 4,395,184 A | | 7/1983 | Braden ........................ 414/17 |
| 4,494,651 A | * | 1/1985 | Malcolm ..................... 206/328 |
| 4,875,581 A | * | 10/1989 | Ray et al. .................... 206/328 |
| 5,104,581 A | | 4/1992 | Ito et al. ...................... 252/511 |
| 5,551,572 A | | 9/1996 | Nemoto ....................... 206/725 |
| 5,672,980 A | * | 9/1997 | Charlton et al. ............. 324/755 |

* cited by examiner

*Primary Examiner*—Mark L. Bell
*Assistant Examiner*—Shalie Manlove
(74) *Attorney, Agent, or Firm*—Laurence A. Greenberg; Werner H. Stemer; Gregory L. Mayback

(57) ABSTRACT

The transport device for electronic components is formed with at least one recess to accommodate an electronic component. In order to protect the component, the recess is provided with an anticontamination coating.

11 Claims, 1 Drawing Sheet

TRANSPORT DEVICE FOR ELECTRONIC COMPONENTS WITH AN ANTICONTAMINATION COATING

BACKGROUND OF THE INVENTION

Field of the Invention

The present invention relates to a transport device (tray) for electronic components. The device has at least one recess, a so-called tray pocket, to accommodate an electronic component. In such transport devices, it is a problem if the contact terminals or soldered connections of the inserted electronic components come into contact with the walls or the bottom of the recess, since in the event of any movement of the electronic components in the recess, abrasion in the recesses can be produced, which can lead to contamination of the electronic components. Such contamination can impair the quality or the service life of the electronic components and there can also be costs in terms of quality during subsequent process steps.

It has been known in the prior art—as described in U.S. Pat. Nos. 5,104,581 and 5,551,572— to add certain mixtures, which are intended to prevent abrasion of the material of the transport device, to the material from which the transport devices are produced. This is done during the production process. In this case, however, only the restricted use of materials is possible, since the materials which can be used must ensure mixing with the material of the transport device and appropriate further processing in order to mold the transport device. On the other hand, that prior art proposes making a specific design of the recess in the transport devices, so that the contact terminals or soldered connections of the electronic components do no longer come in mechanical contact with the transport device. However, this requires a very specific design of the recesses in the transport devices, which restricts the use of the transport devices to very specific components.

SUMMARY OF THE INVENTION

The object of the invention is to provide a transport device for electronic components with a contamination-preventing coating which overcomes the above-noted deficiencies and disadvantages of the prior art devices and methods of this kind, and which guarantees an anticontamination effect for transport devices of any desired type in a way which can be used with different types of electronic components.

With the above and other objects in view there is provided, in accordance with the invention, a transport device for electronic components, comprising a tray body formed with one or more recesses for receiving electronic components, and an anticontamination coating covering at least a portion of the recess.

In other words, the objects of the invention are satisfied in that at least a part of the recess in the transport device is provided with an anticontamination coating. This can be an abrasion-resistant coating or a coating which produces precisely defined, nondamaging abrasion.

In accordance with an added feature of the invention, the anticontamination coating covers only the bottom of the recess, i.e., the surface on which the electronic component subsequently rests. It is also possible for only parts of the bottom of the recess to be provided with this coating, in particular those parts of the bottom on which the soldered connections or contact terminals of the electronic component subsequently rest.

In accordance with an additional feature of the invention, the recess is completely covered with the anti-contamination coating, i.e., the entire recess is provided with the coating.

In accordance with another feature of the invention, the entire transport device may be provided with the anticontamination coating.

In principle, all suitable materials which guarantee abrasion resistance can be used for an abrasion-resistant coating. Accordingly, in accordance with a further feature of the invention, the anticontamination coating is selected from the group of plastic, metal (preferably Sn or Pb compounds), amorphous carbon, $SiN_3$, and silicone.

The following outline provides exemplary embodiments of the abrasion-resistant coating, including material and thickness specifications together with the respective advantages:

Plastic: Coating by means of the dip process, layer thickness about 0.1 mm.
Advantage: This coating process is very inexpensive for the production and it allows high throughput.
Alternatively, plastic may be coating by means of stereolithography and to a layer thickness about 0.1 mm.
Advantage: The process enables precise positioning of the coating, as well achievement of a very resistant surface.
Amorphous carbon: Coating by means of evaporation, layer thickness about 0.05 mm.
Advantage: the amorphous carbon coating provides for a very hard, resistant surface, with microfractal surface structures.
$SiN_3$: Coating by means of evaporation, layer thickness about 0.05 mm.
Advantage: Very hard, resistant surface, microfractal surface structures.
Silicone: Coating by means of spray coating, layer thickness about 0.1 mm.
Advantage: Microfractal surface structure, particularly dirt-repellent (lotus effect).

For a coating with a defined abrasion, the following can be selected:

Metal, in particular Sn or Pb compounds: Coating by means of evaporation, layer thickness about 500–1000 nm.
Advantage: The coating has to a large extent the same layer composition as the soldered connections of the electronic component, that is to say abrasion here is nondamaging for the component.

In accordance with a concomitant feature of the invention, the anticontamination coating ideally has a layer thickness of less than 0.5 mm. In specific terms, the layer thickness can be between 0.001 and 0.1 mm.

Other features which are considered as characteristic for the invention are set forth in the appended claims.

Although the invention is illustrated and described herein as embodied in a transport device for electronic components with an anticontamination coating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
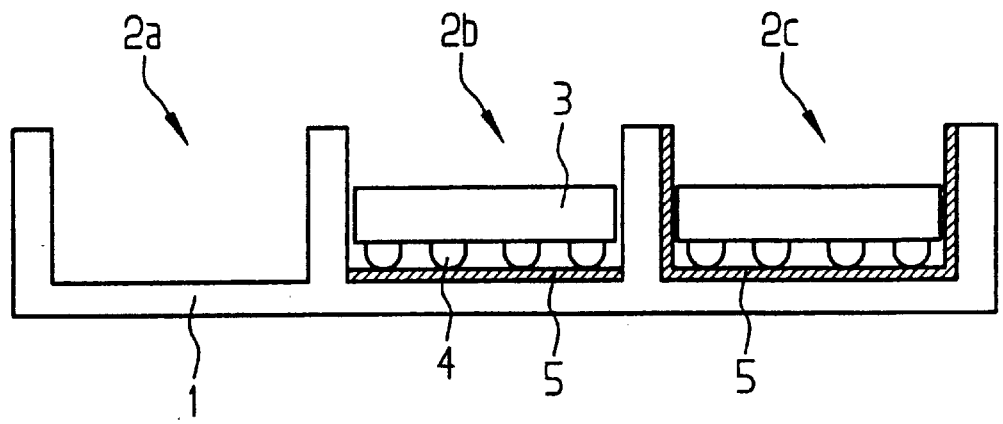
FIG. 1 is a schematic illustration of a section through a transport device according to the invention.

Referring now to the figures of the drawing in detail and first, particularly, to FIG. 1 thereof, there is seen a schematic illustration of a cross section of a transport device 1 or tray 1 according to the invention. Three recesses 2a, 2b, 2c in the tray body are illustrated here by way of example. The recess 2a in this case represents a recess according to the prior art, which has no kind of additional coating on the surface of the recess. According to the invention, provision can then be made for at least the bottom of the recess 2b to be provided with an abrasion-resistant coating 5. This is illustrated at the recess 2b. It is also possible, as in the case of recess 2c, to line the entire recess 2c with an abrasion-resistant coating 5. In principle, it is also possible for the entire transport device 1 to be provided with an abrasion-resistant coating 5. If electronic components 3 are then inserted into the recesses 2b, 2c, then the soldered connections or contact terminals 4 of the electronic component 3 rest on the abrasion-resistant coating 5. At the same time, it must be ensured that the abrasion-resistant coating 5 has been applied in such a way that each point of contact with the electronic component 3 to be inserted has been provided with an abrasion-resistant coating 5. If, then, the electronic component moves within the recess 2b, 2c because of the tolerances provided, the abrasion-resistant coating 5 prevents any abrasion of the material of the transport device, and therefore any contamination of the electronic component 3, which could impair the function or quality of the component in later operation.

Figure 2:
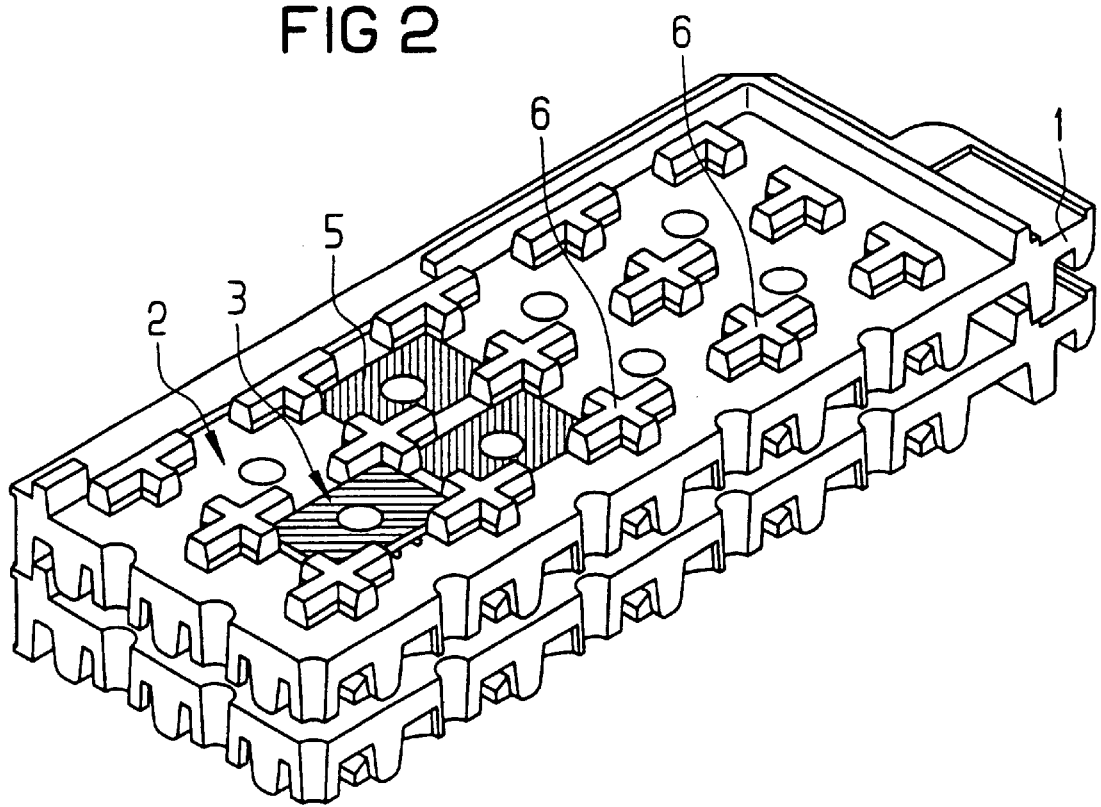
FIG. 2 is a perspective view of a section of the transport device according to the invention.

Referring now to FIG. 2, there is provided an overall view of a transport device 1 which has a plurality of recesses 2 to accommodate electronic components 3. Once again, an abrasion-resistant coating 5 is illustrated here, covering at least the bottom of the recesses 2. As FIG. 2 shows, the recesses 2 do not necessarily have to be formed as trough-like recesses that are separated from one another. It is also possible to provide merely fixing members 6 which subsequently fix the components 3 on the transport device 1. The recesses 2 are thus formed by the space between the individual fixing members 6. In this case, too, it is of course possible for the entire recess 2, that is to say therefore the fixing member 6 as well, or else the entire transport device 1 to be provided with an abrasion-resistant coating 5.

We claim:

1. A transport device for prohibiting a contamination of electronic components during transport of the electronic components, comprising a tray body formed with at least one recess configured to accommodate an electronic component, and an abrasion-resistant coating covering at least a portion of said recess, substantially covering said tray body, and containing a metal selected from the group consisting of Sn and Pb.

2. The transport device according to claim 1, wherein said recess has a bottom, and said abrasion-resistant coating covers said bottom.

3. The transport device according to claim 1, wherein said recess is completely covered with said abrasion-resistant coating.

4. The transport device according to claim 3, wherein said abrasion-resistant coating has a layer thickness of less than 0.5 mm.

5. The transport device according to claim 4, wherein said layer thickness of said abrasion-resistant coating is between 0.001 mm and 0.1 mm.

6. A transport device for prohibiting a contamination of electronic components during transport of the electronic components, comprising a tray body formed with at least one recess configured to accommodate an electronic component, and an abrasion-resistant coating covering at least a portion of said recess, said abrasion-resistant coating containing a material selected from the group consisting of Sn and Pb.

7. The transport device according to claim 6, wherein said recess has a bottom, and said abrasion-resistant coating covers said bottom.

8. The transport device according to claim 6, wherein said recess is completely covered with said abrasion-resistant coating.

9. The transport device according to claim 6, wherein said tray body is substantially covered with said abrasion-resistant coating.

10. The transport device according to claim 6, wherein said abrasion-resistant coating has a layer thickness of less than 0.5 mm.

11. The transport device according to claim 10, wherein said layer thickness of said abrasion-resistant coating is between 0.001 mm and 0.1 mm.

* * * * *